(12) United States Patent
Zach

(10) Patent No.: US 7,928,379 B2
(45) Date of Patent: Apr. 19, 2011

(54) PHASE PLATE, IMAGING METHOD, AND ELECTRON MICROSCOPE

(75) Inventor: Joachim Zach, Oestringen (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 309 days.

(21) Appl. No.: 12/224,667

(22) PCT Filed: Oct. 26, 2007

(86) PCT No.: PCT/EP2007/009289
§ 371 (c)(1),
(2), (4) Date: Sep. 3, 2008

(87) PCT Pub. No.: WO2008/061603
PCT Pub. Date: May 29, 2008

(65) Prior Publication Data
US 2010/0001183 A1    Jan. 7, 2010

(30) Foreign Application Priority Data

Nov. 24, 2006    (DE) .......................... 10 2006 055 510

(51) Int. Cl.
*H01J 37/26*    (2006.01)
(52) U.S. Cl. ............................ 250/307; 250/311; 378/43
(58) Field of Classification Search ................... 250/307
See application file for complete search history.

(56) References Cited

U.S. PATENT DOCUMENTS 5,814,815 A * 9/1998 Matsumoto et al. .......... 250/311
(Continued)

FOREIGN PATENT DOCUMENTS
DE    102 06 703    8/2003
(Continued)

OTHER PUBLICATIONS

Matsumoto et al. "The phase constancy of electron waves traveling through Boersch's electrostatic phase plate". Ultramicroscopy, Amsterdam, NL vol. 63, No. 1, Apr. 1996, pp. 5-10.
Matsumoto et al. "The phase constancy of electron waves traveling through Boersch's electrostatic phase plate". Ultramicroscopy, Amsterdam, NL vol. 63, Nr. 1, Apr. 1996, Pa. 5-10.
Ludwig Reimer "Transmission Electron Microscopy". Physics of Image Formation and Microanalysis Springer-Verlag, Berlin, Heidelberg, New York, Tokyo 1984 p. 199 and following.

*Primary Examiner* — Phillip A Johnston
(74) *Attorney, Agent, or Firm* — Paul Vincent

(57) ABSTRACT

The invention concerns a phase plate for electron optical imaging, wherein the zero beam (4) is phase-shifted in order to obtain an image with optimum contrast through interference with the diffracted electron beams (5, 5'). The shading of diffracted electron beams (5, 5') is kept to a minimum and shading that cannot be reconstructed from the obtained image data is prevented. This is achieved in that the electrode (1') is designed as a shielded conductor (7), which is disposed to extend from a mounting (8) in a substantially radial direction towards the area of the zero beam (4), wherein the shielded conductor (7) has an end (9) in front of the area of the zero beam (4) such that a field (6) is formed between the conductor (7) and the shielding (10) surrounding it, which overlaps this area. The invention also concerns an imaging method for complete reconstruction of the image and an electron microscope (12) which is provided with the phase plate (1).

19 Claims, 2 Drawing Sheets

| U.S. PATENT DOCUMENTS | | | |
|---|---|---|---|
| 6,674,078 B2 * | 1/2004 | Nagayama et al. | 250/311 |
| 6,797,956 B2 | 9/2004 | Benner | |
| 7,741,602 B2 * | 6/2010 | Benner et al. | 250/311 |
| 2003/0066964 A1 | 4/2003 | Nagayama | |
| 2010/0065741 A1 * | 3/2010 | Gerthsen et al. | 250/311 |

| FOREIGN PATENT DOCUMENTS | | |
|---|---|---|
| EP | 0 782 170 | 7/1997 |
| JP | 2006 162805 | 6/2006 |
| WO | WO 03/068399 | 8/2003 |

* cited by examiner

PHASE PLATE, IMAGING METHOD, AND ELECTRON MICROSCOPE

This application is the national stage of PCT/EP2007/009289 filed on Oct. 26, 2007 and also claims Paris Convention priority to DE 10 2006 055 510.4 filed on Nov. 24, 2006.

BACKGROUND OF THE INVENTION

The invention concerns a phase plate for electron optical imaging, wherein the electron beam is split by an object into a zero beam and diffracted electron beams, wherein the phase plate is designed as an electrode for phase-shifting the zero beam using an electric field generated by a voltage, in order to obtain a high-contrast image through its interference with diffracted electron beams.

The invention also concerns an imaging method, wherein an image that is generated through electron optics and of which image information is lost due to partial shading of the optical path of the diffracted beams, is reconstructed by utilizing the image information that is identical to the lost image information and is located centrally symmetrically opposite to the zero beam.

The invention also concerns an electron microscope, wherein a phase plate of the above-mentioned type is disposed in the objective focal plane of the zero beam.

In electron microscopy, many objects are almost transparent to the beam, as in light microscopy, such that only little amplitude contrast is obtained with conventional imaging. Both types of beam are phase-shifted in a position dependent fashion during passage through the object in dependence on the structure of the object. The beam is thereby divided on the object into an undiffracted so-called zero beam and diffracted beams of several orders of diffraction.

When the zero beam is phase-shifted, preferably through 90°, the phase modulation of the object is changed into a strong amplitude contrast when the zero beam is again superposed with the diffracted beams in the image plane. This is the well-known phase contrast (see e.g. Reimer, Transmission Electron Microscopy, page 199 ff, Berlin, Heidelberg, New York 1984). The fact that the beams form different focal points in the focal plane of the objective is utilized for such a phase shift. The zero beam forms a central focal point in the focal plane for the zero beam and is surrounded by the focal points of the diffracted beams of the different orders of diffraction, starting with the diffraction of first order, which are substantially in the same focal plane. This fact can be utilized to either phase-shift the zero beam or the diffracted beams in order to eliminate the phase difference to increase the amplitudes. The invention is thereby based on a phase-shift of the zero beam.

In contrast to light optics, electron beams are disadvantageous in that there is no transparent plate that can carry a phase plate. In order to solve this problem, phase plates of the above-mentioned type were proposed which differ, however, with respect to the precise designs, as is explained below. With respect to all phase plates of this type, it must be noted that it is not technically possible to only shift the phase of the zero beam, since this would require an electric field in the nanometer range which cannot be generated with present technology. For this reason, depending on the design of the respective phase plate, at least a few low orders of diffraction also experience a phase shift. The term "phase plate" which is derived from light microscopy, is rather symbolically used in the field of electron microscopy, since it usually does not concern a plate-shaped component, and includes the components that are required to obtain the phase shift.

EP 0 782 170 A2 proposes a phase plate and an electron microscope, wherein a ring-shaped electrode is provided having a bore in the area of the zero beam, in which it generates the phase-shifting electric field. The ring-shaped electrode is connected at opposite sides to holding arms which extend to the housing of the electron microscope. A phase plate of this type has several disadvantages. Firstly, the ring that must have a certain size due to mechanical and production reasons, shields off beams in the vicinity of the zero beam. Since these are the diffracted beams of highest intensity, many beams for forming the contrast are lost. Moreover, the opening of the ring must be very small in order to prevent inclusion of an excessive number of low orders of diffraction for the phase shift, since these are then also lost for the formation of contrast. This, in turn, causes this small central bore to quickly soil and become clogged through contamination. Another disadvantage is that the holding arms for the ring extend through the optical path of the beams of higher order diffraction, with the consequence that shading also occurs and information is lost.

In order to solve the last-mentioned problem, DE 102 06 703 A1 proposes a phase plate and a method of the above-mentioned type, wherein the ring electrode is held by holding arms which are not centrally symmetrically disposed, such that those arms do not generate any shading of the kind caused by arms which are disposed at 180° opposite to each other with respect to the zero beam passing through the bore of the ring electrode. The shading of the holding arms can thereby be reconstructed through an imaging method of the above-mentioned type. The above-mentioned problems with the ring electrode remain, however, unsolved, in particular, their shading extends over the area of a ring that extends around the optical axis, which in this respect excludes any of the above-mentioned recombination possibilities.

DE 10 2005 040 267 A1 discloses a method for generating a phase plate of the above-mentioned type with a ring electrode, which is designed in layers like a sandwich and is then provided with the bore for the ring electrode. The latter, however, also has the above-mentioned shading.

JP 2006162805 A proposes preventing adhesion of protective particles on a phase plate through electrostatic forces. Towards this end, a corresponding layer design for a phase plate is proposed. This design of the phase plate, however, has nothing to do with the above-mentioned question of image recombination through centrally symmetrically opposite image information.

A further proposal according to EP 0 782 170 A2 avoids the ring structure of the electrode, which also eliminates the above-mentioned problems associated therewith. This proposal in accordance with FIG. 3 and the associated description corresponds to the phase plate of the above-mentioned type. As to the design of such an electrode, the only proposal consists in that a conductor is directly tangentially guided past the zero beam. In order to ensure that the electric field emitted by this conductor preferably only influences the zero beam, FIG. 3 and the associated description propose to surround it with an insulating layer and an earthed shielding layer which is removed from the periphery of the entire conductor in the area of the zero beam, such that an electric field is generated between the conductor and the two circular ring shaped ends of the shielding layers, which overlaps the zero beam on one side of the conductor. This eliminates the above-mentioned problems with the ring electrode, but the problem that the shielded conductor passes through the entire optical path of the diffracted beams and generates correspondingly large shadows remains. This conductor with insulation and shielding is essentially minimally offset with respect to the focal point of the zero beam, such that also in this case, the areas which are centrally symmetrically offset by 180° with respect to the focal point of the zero beam are shaded. Apart from the fact that EP 0 782 170 A2 does not propose recombination, such recombination would not be possible due to the above-mentioned fact. One further problem inherent with this proposal is the fact that the conductor also generates an electric field on the side facing away from the zero beam, since it is also exposed without shielding at that location. In consequence thereof, the diffracted beams that extend there are also phase-shifted and are therefore no longer available for increasing the amplitude.

DE 102 00 645A1 proposes providing an aperture collimator that bears an annular phase plate which extends along the collimator border in the form of a narrow edge and is designed e.g. as an annular electrode with an inner electrode and outer earth electrodes. Alternatively, this annular phase plate is inwardly offset from the aperture collimator and held by arms. In order to ensure that the zero beam reaches the area of the field of this electrode, the optical path is correspondingly tilted. This solves the problem that there is no small bore that could be soiled or clogged through contamination. On the other hand, it takes some effort to appropriately tilt the optical path about the exact angle. In the first embodiment, the aperture collimator cuts away more than half of the diffracted beams due to its arc shape, which excludes a combination between the proposed solution and the above-mentioned image reconstruction. In the second embodiment, the aperture collimator is outside of the optical path, but the annular field acts not only on the zero beam but also in arcs through the entire optical path of the different orders of diffraction to the edge of the optical path, as in the first embodiment. With this electric field design, the part of the diffracted beams, which is thereby influenced, can no longer be used to increase the amplitude due to the phase shift generated by the field. Nor is recombination of the image possible, since the field generates phase shift on areas which are 180° opposite to the zero beam.

It is therefore the underlying purpose of the invention to provide a phase plate and an electron microscope, wherein shading by the phase plate is reduced to a minimum and no shading occurs that cannot be reconstructed. With respect to the imaging method, the object consists in enabling complete recombination of the image.

SUMMARY OF THE INVENTION

With respect to the phase plate of the above-mentioned type, this object is achieved in that the electrode is designed as a shielded conductor which can be disposed so as to extend from a mounting substantially in a radial direction towards the area of the zero beam, wherein the shielded conductor has an end upstream of the zero beam area, such that a field is generated between the conductor and its surrounding shielding, which includes this area.

With respect to the imaging method of the above-mentioned type, this object is achieved in that the image is completely reconstructed by using a phase plate which is entirely disposed on one side of the zero beam and is used to generate a phase shift thereof.

With respect to the electron microscope of the above-mentioned type, the object is achieved in that the electrode is designed as a shielded conductor which extends from a mounting substantially in a radial direction towards the area of the zero beam, wherein the shielded conductor has an end upstream of the area of the zero beam, such that a field formed between the shielding and the conductor overlaps this area.

The basic idea of the invention consists in that the electric field is generated by a conductor end of minimum size, which is surrounded by an earthed, and also conducting covering, separated by an insulator. In this fashion, a very small electric field can be generated between the conductor and the surrounding shielding, in order to overlap or shield a minimum amount of beams in addition to the zero beam through the field, thereby ensuring that a maximum amount of diffracted beams of high intensity located in the vicinity of the zero beam can further be utilized to enhance contrast. In addition to this advantage, the inventive phase plate offers the possibility to guide the electric field to the zero beam only from one side, such that no areas are shaded which are disposed 180° opposite to each other with respect to the zero beam. The inventive phase plate thereby provides an imaging method with complete reconstruction of the image. With respect to further precise embodiments of the imaging method, reference is made to previously published material, in particular DE 102 06 703 A1. In accordance with the invention, this method enables complete image reconstruction for the first time.

The invention also provides an electron microscope with high-contrast images of semi-transparent objects through use of the inventive phase plate and an imaging method which completely reconstructs shading of this phase plate, without impairing the quality of image areas by shading.

In a further development of the phase plate, the conductor that is used as an inner electrode is slightly backwardly offset at its end with respect to the surrounding shielding. In this fashion, the generated field can be defined within even tighter limits, thereby detecting even less diffracted beams in addition to the zero beam. The diffracted beams are thereby available for interference with the zero beam, and the contrast of the images is improved.

Since an insulator is usually disposed between the conductor and the shielding, the insulator may suitably be backwardly offset with respect to the conductor and the shielding. In this fashion, charging of the insulator by radiation can be prevented, which does not only disturb generation of the field but can possibly also disturb the stability of the zero beam. Charging of the insulator may alternatively or additionally also be prevented in that the insulator has a residual conductivity of such a magnitude that possible accumulated charge is discharged to prevent disturbance of the field and/or deflection of the zero beam.

In accordance with a further proposal, the electrode is held by a carrier. In order to minimize the electric field, the electrode including conductor, insulator and shielding must have a minimum cross-section, wherein the smallest technically possible and economically reasonable size is aimed for. For this reason, the rigidity is no longer sufficient for the electrode to be self-supporting. The electrode can be designed with a minimum cross-section, since it is held by the carrier.

In order to prevent the carrier from shielding intense beams of low orders of diffraction, the electrode extends beyond the carrier only up to the minimum amount, which is permitted by its rigidity and hence self-supportability. A cross-section of the carrier that tapers from the outside to the inside also serves this purpose. In this fashion, the shielding is kept at a minimum at that location where it accepts the highest radiation intensity, and at the same time, the carrier has a larger cross-section at locations where this is necessary for statics reasons.

Since the separation between the end of the electrode where the electric field is generated, and the zero beam should be minimum, in order to only influence the zero beam, it is suitable to make provisions that readjustment is possible at any time. Towards this end, a further development of the phase plate proposes to provide the electrode with an actuating mechanism by means of which the end of the shielded conductor can be adjusted with respect to the zero beam. The electrode may thereby additionally or alternatively have an upstream beam deflection device in the beam direction, which can deflect the zero beam in such a fashion that it can be positioned relative to the electric field.

With respect to the above-mentioned imaging method, in a suitable further development, the image contrast is detected and the strength and/or position of the electric field in relation to the zero beam are changed until an optimum image contrast is obtained. The method is thereby suitably carried out through a corresponding control means. The electric field is thereby adjusted using the corresponding voltage potential. The relative position of the electric field and the zero beam can be adjusted by either positioning the end of the phase plate, which generates the field, in order to optimize the phase shift or, alternatively, positioning the zero beam relative to the field through deflection in order to optimize the phase shift.

The electron microscope may be provided with a phase plate that comprises all above-mentioned further developments. The electron microscope may also be designed in such a fashion that it can function in accordance with all further developments of the above-mentioned imaging method. In particular, the electron microscope can be provided with an actuating mechanism for the electrode in correspondence with the above-described phase plate, by means of which the end of the shielded conductor can be adjusted with respect to the zero beam area. Alternatively or simultaneously, the electron microscope may comprise a beam deflecting device that is disposed upstream of the electrode, which can deflect the zero beam in such a fashion that it can be positioned relative to the electric field. Such a beam deflection device may be disposed upstream of the object, between the object and the objective or between the objective and the objective focal plane of the zero beam. It may be a means for generating an electric field and/or a magnetic field, by means of which the zero beam can be moved to the optimum position with respect to the phase-shifting field. With the above-mentioned fields, the diffracted beams are naturally also deflected and adjusted with the zero beam. This is necessary, since their central symmetry with the zero beam must be maintained for renewed superposition.

In a further embodiment of the electron microscope, a detector means and image evaluation and control means are provided for detecting the image contrast and controlling the voltage for generating the electric field. These means may moreover position the end of the shielded conductor in relation to the zero beam using the actuating mechanism and/or position the zero beam towards the end of the shielded conductor using the beam deflection device. These adjustments are performed by the control means until an optimum image contrast is obtained. A correspondingly designed program thereby provides fast detection of the optimum settings.

The invention is explained below with reference to an embodiment shown in the drawing.

DESCRIPTION OF THE PREFERRED EMBODIMENT

Figure 1:
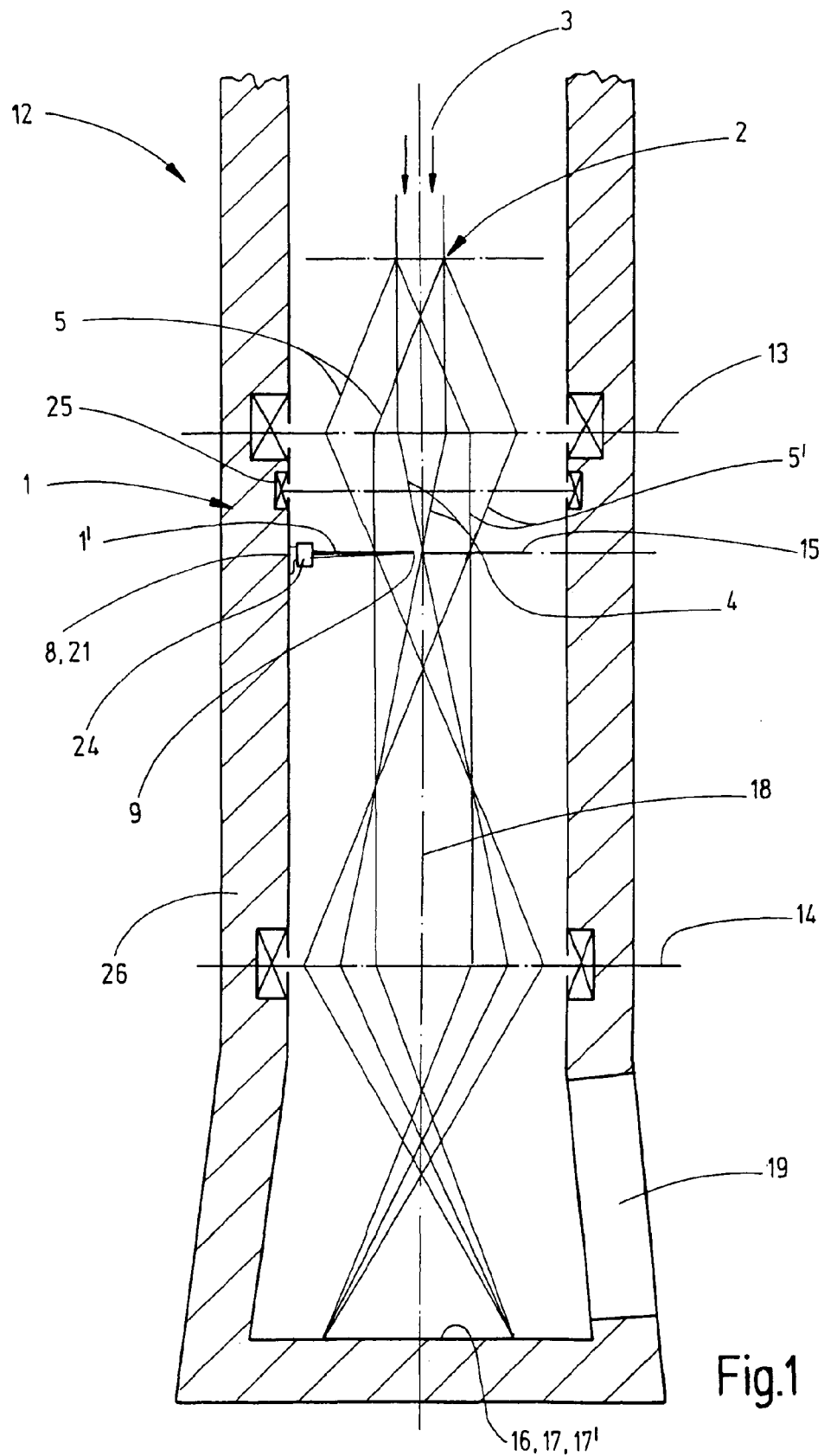
FIG. 1 shows a schematic diagram of an inventive electron microscope with a phase plate.

FIG. 1 shows a schematic diagram of an electron microscope 12 with an inventive phase plate 1 which is designed as electrode 1'. Only the essential components of the electron microscope 12 are shown, wherein beam generation and the area where the beam is shaped are also omitted. Only the lower tube part of the electron microscope 12 is shown, which contains an objective 13, a projection lens 14, the monitor 16 and detector means 17 and 17', respectively, embedded in the housing wall 8. An intermediate lens system or other means are not shown.

The electron beam 3 is directed onto an object 2 and is partially diffracted there, such that diffracted electron beams 5, 5' are generated next to the zero beam 4. The beams 4, 5, 5' are refracted by the objective 13, wherein the focal points of the beams 4, 5, 5' are in the focal plane 15 of the objective of the zero beam 4. Only two focal points, offset from each other through 180°, of diffracted beams 5, 5' of one order of diffraction are thereby illustrated. The term objective focal plane 15 of the zero beam 4 was chosen, since its focal point forms the reference point when there are even slight deviations from the focal points of the diffracted beams 5, 5'. The focal points of the diffracted electron beams 5, 5' are disposed at a radial separation from the focal point of the zero beam 4, wherein the focal point of the zero beam 4 forms the center and is externally surrounded in stages in accordance with the orders of diffraction by the focal points of all diffracted electron beams 5, 5', which generally form a centrally symmetrical pattern. This fact is utilized to generate a small electric field 6 with the electrode 1' using the phase plate 1 (FIG. 2), which substantially only overlaps the zero beam 4, wherein the latter can be phase-shifted in such a fashion that a high-contrast image is obtained during imaging on the projection surface 16 or detector means 17 or 17' by an increase in amplitude during renewed superposition of the beams 4, 5, 5'.

In order to ensure that the electric field 6 substantially only overlaps the zero beam 4, readjustment would be suitable, since the minimum distance to be kept can be changed through the smallest influences. For this reason, it is proposed that the electrode 1' with carrier 20 has an actuating mechanism 24 which permits readjustment of the end 9 of the shielded conductor 7 (FIG. 2) with respect to the focal point of the zero beam 4. The actuating mechanism 24 is thereby only symbolically shown. Alternatively or simultaneously, such readjustment can also be achieved by providing a beam deflection device 25 disposed upstream of the objective focal plane 15 of the zero beam 4 and designed in such a fashion that it can shift the optical path 4, 5, 5' by very small dimensions by generating a corresponding electric or magnetic field, such that the focal point of the zero beam 4 is at an optimum position with respect to the electric field 6. This positioning is shown on an enlarged scale in FIG. 2.

For reasons of completeness, a viewing window 19 is shown through which the image generated by the electron beam 3 can be directly viewed on the projection surface 16. The control means is not shown, which performs the imaging method, by generating a reconstructed image on a monitor (not shown either) using information obtained by the detector means 17.

In addition to the detector means 17, a detector means 17', which may or may not be identical thereto, may be provided, and is used to control the position of the zero beam 4 with respect to the electric field 6 and also the strength of the electric field 6 by detecting the image contrast and adjusting the above-mentioned values to obtain optimum image contrast.

Figure 2:
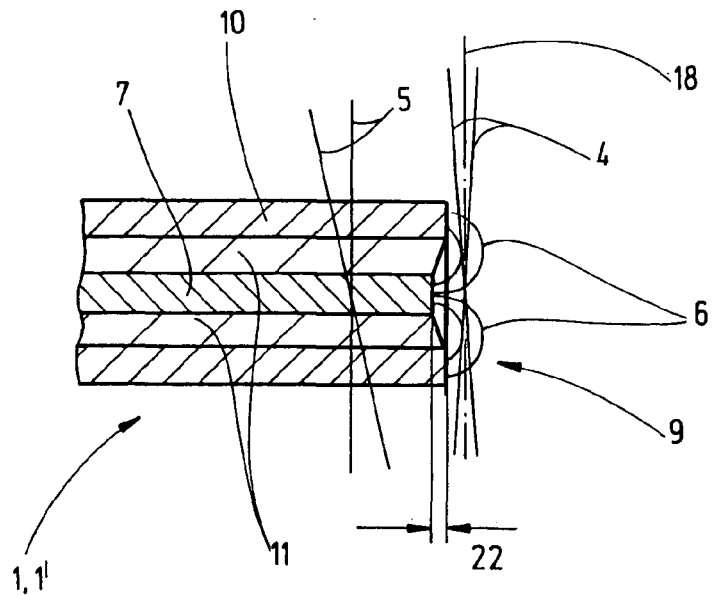
FIG. 2 shows a sectional view of the electrode tip of an inventive phase plate including electric field and zero beam.

FIG. 2 shows a sectional view of the electrode tip of a phase plate 1 with electric field 6 and zero beam 4. The zero beam 4 is located on the optical axis 18, which is also shown in FIG. 1. The above-mentioned means enable exact positioning of the end 9 of the shielded conductor 7 in such a fashion that the electric field 6 subtends only very few diffracted electron beams 5, 5', in addition to the zero beam 4. The electric field 6 may thereby be localized with more precision by backwardly offsetting the conductor 7, that forms the inner electrode, with respect to the shielding 10, thereby even further delimiting the field 6. The electrode 1' consists of conductor 7, insulator 11 and shielding 10, wherein the cross-section of the electrode 1' has a minimum size in order to localize the electric field 6, to the extent possible, in the area of the focal point of the zero beam 4.

Figure 3:
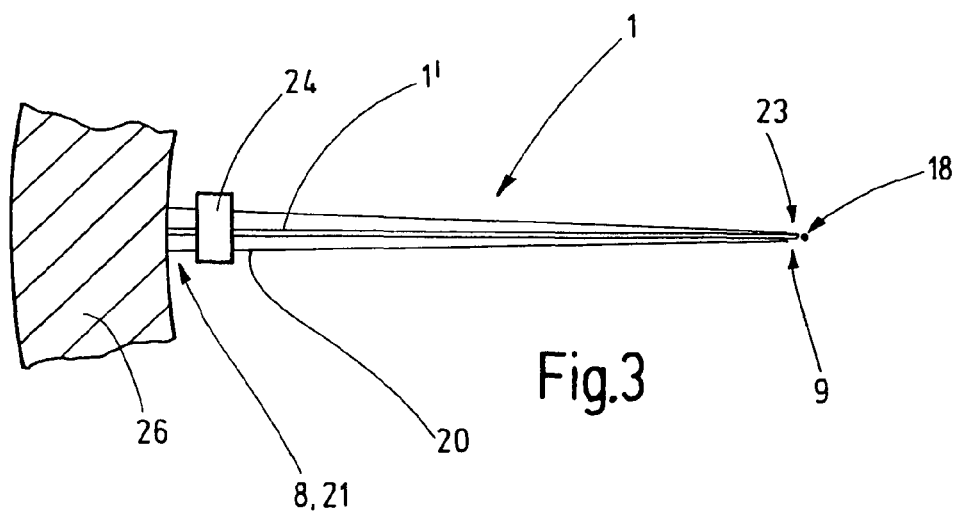
FIGS. 3 and 4 show a phase plate with carrier and actuating mechanism.
Figure 4:
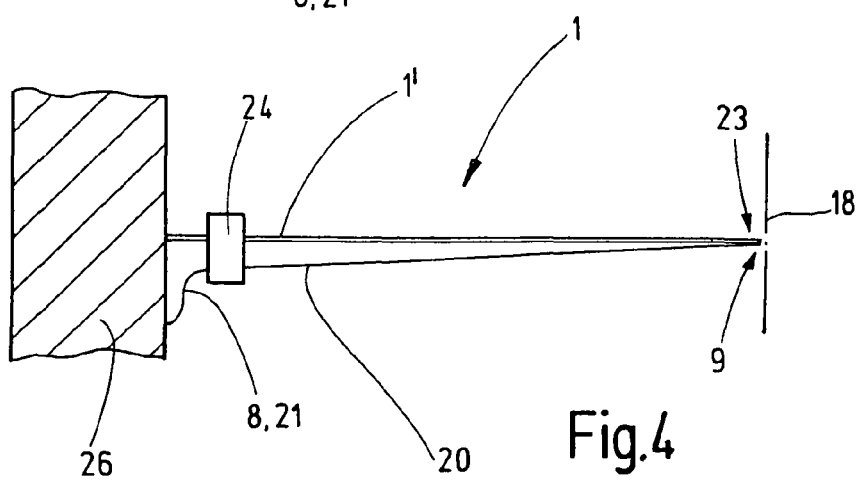

FIGS. 3 and 4 show a phase plate 1, wherein the electrode 1' is held by a carrier 20 which is mounted to the housing wall 26 of the electron microscope 12 using a mounting 8, e.g. a holder 21. The carrier 20 has a relatively wide cross-section in the area of the housing wall 26 and tapers towards the optical axis 18. In this fashion, the cross-section required by statics is given at any location, and shielding of the beams 5, 5' by the carrier 20 is reduced to a minimum, in particular in the vicinity of the optical axis 18.

This is even further improved in that the electrode 1' protrudes 23 past the carrier 20 to such an extent that the electrode 1' is self-supporting in this area. The illustrated box symbolically shows an actuating mechanism 24, which permits moving the end 9 of the shielded conductor 7 and thereby the field 6 into the optimum position with respect to the zero beam 4.

The drawing naturally only shows one example. The inventive phase plate 1 can also be used various electron-optical imaging methods in instruments, which may also have a different design compared to the illustrated electron microscope 12. The design of the electrode 1' and the carrier 20 may differ, in particular, the cross-sectional surface of the electrode 1' may differ. Round, square or rectangular shapes can be selected. The electrode 1' may not have the same cross-section along its entire length for generating a minimum-size electric field 6, but have a tip that tapers to a smaller cross-section. Essential to the invention is basically only the fact that there is no shading that is centrally symmetrically offset by 180° with respect to the zero beam 4. All embodiments that meet this condition utilize the basic idea of the invention.

| List of Reference Numerals | |
|---|---|
| 1 | phase plate |
| 1' | electrode |
| 2 | object |
| 3 | electron beam |
| 4 | zero beam |
| 5, 5' | diffracted electron beams |
| 6 | electric field |
| 7 | shielded conductor |
| 8 | mounting (e.g. on the housing wall) |
| 9 | end of shielded conductor |
| 10 | shielding |
| 11 | insulator |
| 12 | electron microscope |
| 13 | objective |
| 14 | projection lens |

-continued

| List of Reference Numerals | |
|---|---|
| 15 | objective focal plane of the zero beam |
| 16 | projection surface |
| 17, 17' | detector means |
| 18 | optical axis |
| 19 | viewing window |
| 20 | carrier |
| 21 | holder |
| 22 | backward offset |
| 23 | protrusion |
| 24 | actuating mechanism |
| 25 | beam deflection device |
| 26 | housing wall |

I claim:

1. A phase plate for electron optical imaging, wherein an electron beam is divided by an object into a zero beam and diffracted electron beams, the phase plate being designed as an electrode that extends into an area of the zero beam for phase-shifting the zero beam using an electric field generated by a voltage in order to obtain a high-contrast image through interference with the diffracted electron beams, the electrode comprising:
    a mounting;
    a conductor disposed to extend in a substantially radial direction from said mounting to the area of the zero beam; and
    a shielding disposed proximate to and surrounding said conductor and extending from said mounting to the area of the zero beam, wherein said conductor and said shielding have an end proximate the zero beam from which the electric field is formed to extend between said conductor and said shielding while overlapping the zero beam.

2. The phase plate of claim 1, wherein said conductor is an inner electrode having an end slightly backwardly offset with respect to an end of said surrounding shielding.

3. The phase plate of claim 1, further comprising an insulator disposed between said conductor and said shielding.

4. The phase plate of claim 3, wherein said insulator is backwardly offset with respect to said conductor and said shielding.

5. The phase plate of claim 3, wherein said insulator has a residual conductivity which is of such a magnitude that possible charge is discharged in such a fashion that disturbance of said field and/or deflection of the zero beam is prevented.

6. The phase plate of claim 1, wherein said mounting comprises a carrier for holding the electrode.

7. The phase plate of claim 6, wherein the electrode protrudes past a front end of said carrier.

8. The phase plate of claim 6, wherein said carrier has a cross-section which tapers from a outside to an inside.

9. The phase plate of claim 1, further comprising an actuating mechanism for adjusting said end of said shielded conductor and said shielding with respect to the area of the zero beam.

10. The phase plate of claim 1, further comprising a beam deflecting device disposed upstream of the electrode to deflect the zero beam in such a fashion that it can be positioned with respect to the electric field.

11. A method for imaging using the phase plate of claim 1, the method comprising the steps of:
    a) generating an incomplete image, the incomplete image having lost image information caused by partial shading of optical paths of diffracted beams;
    b) disposing the phase plate on one side of a zero beam;

c) phase shifting the zero beam using the phase plate; and
d) reconstructing a complete image using image information that is identical to the lost image information and located centrally symmetrically opposite to the zero beam.

12. The imaging method of claim 11, wherein an image contrast is detected and an electric field of the phase plate is changed with respect to strength and/or positioning in relation to the zero beam until an optimum image contrast is obtained.

13. The imaging method of claim 11, wherein a field-generating end of the phase plate is positioned relative to the zero beam in such a fashion that the phase shift is optimized.

14. The imaging method of claim 11, wherein the zero beam is positioned in relation to an electric field of the phase plate through deflection in order to optimize a phase shift.

15. An electron microscope, wherein an electron beam is divided by an object into a zero beam and diffracted electron beams, the microscope comprising the phase plate of claim 1, disposed in an objective focal plane of the zero beam.

16. The electron microscope of claim 15, further comprising detector means and imaging means designed to generate an incomplete image through electron optics, the incomplete image having lost image information due to partial shading of an optical path through the phase plate, the imaging means reconstructing image information identical to the lost image information and located centrally symmetrically opposite to the zero beam, wherein the phase plate is located on one side of the zero beam only, thereby permitting complete reconstruction.

17. The electron microscope of claim 15, further comprising an actuating mechanism for adjusting the end of the shielding and conductor with respect to the area of the zero beam.

18. The electron microscope of claim 15, further comprising a beam deflecting device disposed upstream of the electrode, through which the zero beam can be deflected in such a fashion that it can be positioned relative to the electrical field.

19. The electron microscope of claim 15, further comprising a detector means and an image evaluation and control means for detecting an image contrast, controlling a voltage for generating the electric field, and positioning the end of the shielding and conductor relative to the zero beam using an actuating mechanism and/or positioning the zero beam towards said end of said shielding and conductor using a beam deflecting device until an optimum image contrast is obtained.

* * * * *